(12) United States Patent
Ahn et al.

(10) Patent No.: US 11,943,988 B2
(45) Date of Patent: Mar. 26, 2024

(54) COLOR FILTER UNIT AND DISPLAY APPARATUS HAVING THE SAME

(71) Applicant: Samsung Display Co., LTD., Yongin-si (KR)

(72) Inventors: Jeaheon Ahn, Yongin-si (KR); Seongyeon Lee, Yongin-si (KR); Jeongki Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 326 days.

(21) Appl. No.: 17/189,241

(22) Filed: Mar. 1, 2021

(65) Prior Publication Data

US 2021/0399057 A1    Dec. 23, 2021

(30) Foreign Application Priority Data

Jun. 23, 2020 (KR) .................. 10-2020-0076761

(51) Int. Cl.
| | |
|---|---|
| *H10K 59/38* | (2023.01) |
| *G02B 5/22* | (2006.01) |
| *H10K 50/115* | (2023.01) |
| *H10K 50/13* | (2023.01) |
| *H10K 50/844* | (2023.01) |
| *H10K 50/854* | (2023.01) |
| *H10K 59/122* | (2023.01) |

(52) U.S. Cl.
CPC .......... *H10K 59/38* (2023.02); *H10K 50/115* (2023.02); *H10K 50/131* (2023.02); *H10K 50/844* (2023.02); *H10K 59/122* (2023.02)

(58) Field of Classification Search
CPC .... H10K 50/131; H10K 59/38; H10K 59/122; H10K 59/127; G03F 7/20; H05B 33/02
See application file for complete search history.

(56) References Cited

U.S. PATENT DOCUMENTS

| | | | |
|---|---|---|---|
| 9,703,191 B2 * | 7/2017 | Park | G03F 7/20 |
| 10,185,066 B2 | 1/2019 | Chae et al. | |
| 2011/0084290 A1 * | 4/2011 | Nakamura | H10K 50/8426 257/89 |

(Continued)

FOREIGN PATENT DOCUMENTS

| | | |
|---|---|---|
| CN | 110288904 | 9/2019 |
| EP | 3605162 | 2/2020 |

(Continued)

OTHER PUBLICATIONS

Extended European Search Report dated Nov. 18, 2021, in European Patent Application No. 21181114.6.

*Primary Examiner* — Walter H Swanson
*Assistant Examiner* — Jacob T Nelson
(74) *Attorney, Agent, or Firm* — H.C. Park & Associates, PLC

(57) ABSTRACT

A color filter unit and a display apparatus including the same is provided, wherein the color filter unit includes an upper substrate, a first-color color filter layer, a second-color color filter layer, and a third-color color filter layer on a first surface that is a lower surface of the upper substrate, a transparent layer on the first-color color filter layer and having one or more protrusions in a direction away from the first surface, a second color quantum dot layer on the second-color color filter layer, and a third color quantum dot layer on the third-color color filter layer.

14 Claims, 13 Drawing Sheets

(56) References Cited

U.S. PATENT DOCUMENTS

| | | |
|---|---|---|
| 2012/0098414 A1 | 4/2012 | Nakamura |
| 2017/0288174 A1* | 10/2017 | Ueda ................... H10K 50/856 |
| 2019/0025638 A1* | 1/2019 | Kim ................... G02F 1/133528 |
| 2019/0155106 A1* | 5/2019 | Lee ................... G02F 1/133514 |
| 2020/0041709 A1 | 2/2020 | Lee et al. |
| 2020/0152704 A1 | 5/2020 | Jang et al. |
| 2020/0266243 A1 | 8/2020 | Kim et al. |
| 2020/0266253 A1 | 8/2020 | Kim et al. |
| 2021/0050388 A1 | 2/2021 | Song |

FOREIGN PATENT DOCUMENTS

| | | |
|---|---|---|
| JP | 2010287421 | 12/2010 |
| KR | 10-2012-0001719 | 1/2012 |
| KR | 10-2019-0001719 | 1/2012 |
| KR | 10-2018-0018945 | 2/2018 |

\* cited by examiner

COLOR FILTER UNIT AND DISPLAY APPARATUS HAVING THE SAME

CROSS-REFERENCE TO RELATED APPLICATION

This application is based on and claims priority under 35 U.S.C. § 119 to Korean Patent Application No. 10-2020-0076761, filed on Jun. 23, 2020, in the Korean Intellectual Property Office, the disclosure of which is incorporated by reference herein in its entirety.

BACKGROUND

Field

One or more embodiments relate to a color filter unit and a display apparatus having the color filter unit, and more particularly, to a color filter unit having an improved defect rate and an improved viewing angle, and a display apparatus having the color filter unit.

Discussion of the Background

A display apparatus is an apparatus visually displaying data. A display apparatus may be used as a display unit of a small-sized product such as a mobile phone, or may be used as a display unit of a large-sized product such as a television.

A display apparatus includes a plurality of pixels receiving electrical signals to emit light to display an image to the outside. Each pixel includes a light-emitting element, for example, an organic light-emitting display apparatus includes an organic light-emitting diode (OLED) as the light-emitting element. Generally, an organic light-emitting display apparatus includes a thin-film transistor and an OLED on a substrate, and the OLED operates by emitting light by itself.

Recently, as use of display apparatuses has been diversified, various designs have been attempted to improve the quality of the display apparatuses. Particularly, as high resolution of display apparatuses progresses, research into improving color reproducibility of each pixel of display apparatuses has been actively conducted.

In the case of a color filter unit and a display apparatus including the color filter unit in the related art, a viewing angle is narrowed due to a defect in a manufacturing operation or a brightness ratio of light with respect to a front surface and a side surface.

The above information disclosed in this Background section is only for understanding of the background of the inventive concepts, and, therefore, it may contain information that does not constitute prior art.

SUMMARY

One or more embodiments provide a color filter unit having an improved defect rate and an improved viewing angle and a display apparatus including the same.

Additional aspects will be set forth in part in the description which follows and, in part, will be apparent from the description, or may be learned by practice of the presented embodiments of the disclosure.

According to an embodiment, a color filter unit includes an upper substrate, a first-color color filter layer, a second-color color filter layer, and a third-color color filter layer on a first surface that is a lower surface of the upper substrate, a transparent layer on the first-color color filter layer and having one or more protrusions in a direction away from the first surface, a second color quantum dot layer on the second-color color filter layer, and a third color quantum dot layer on the third-color color filter layer.

According to the present embodiment, the transparent layer may include scattering particles.

According to the present embodiment, the color filter unit may further include a partition between the transparent layer and the second color quantum dot layer, and a spacer on the partition.

According to the present embodiment, a layer structure of the spacer may be the same as a layer structure of the transparent layer.

According to the present embodiment, the spacer may include the same material as that of the transparent layer.

According to the present embodiment, the spacer and the transparent layer may each include scattering particles.

According to the present embodiment, the color filter unit may further include a first protective layer between the first-color color filter layer and the transparent layer and covering an upper surface of the second color quantum dot layer and an upper surface of the third color quantum dot layer.

According to the present embodiment, the first protective layer may be integral over an entire surface of the upper substrate.

According to the present embodiment, the second color quantum dot layer may convert light having a wavelength in a first wavelength band into light having a wavelength in a second wavelength band, and the third color quantum dot layer may convert light having a wavelength in the first wavelength band into light having a wavelength in a third wavelength band.

According to another embodiment, a display apparatus includes a display unit including a lower substrate and a first display element, a second display element, and a third display element on the lower substrate, and a color filter unit including an upper substrate having a first surface that is a lower surface facing the first display element, the second display element, and the third display element, wherein the color filter unit includes a first-color color filter layer, a second-color color filter layer, and a third-color color filter layer on the first surface of the upper substrate to respectively overlap the first display element, the second display element, and the third display element, a transparent layer on the first-color color filter layer and having one or more protrusions in a direction away from the first surface, a second color quantum dot layer on the second-color color filter layer, and a third color quantum dot layer on the third-color color filter layer.

According to an embodiment, the one or more protrusions may contact an uppermost layer of the display unit.

According to the present embodiment, the transparent layer may include scattering particles.

According to an embodiment, the display unit may further include a pixel defining film between the first display element and the second display element, the color filter unit may further include a partition between the transparent layer and the second color quantum dot layer, and a spacer between the pixel defining film and the partition and contacting the uppermost layer of the display unit.

According to the present embodiment, a layer structure of the spacer may be the same as a layer structure of the transparent layer.

According to the present embodiment, the spacer may include the same material as that of the transparent layer.

According to the present embodiment, the spacer and the transparent layer may each include scattering particles.

According to the present embodiment, the second color quantum dot layer may be between the second-color color filter layer and the second display element, and the third color quantum dot layer may be between the third-color color filter layer and the third display element.

According to the present embodiment, the color filter unit may further include a first protective layer between the first-color color filter layer and the transparent layer and covering a surface of the second color quantum dot layer in a direction of the second display element and a surface of the third color quantum dot layer in a direction of the third display element.

According to the present embodiment, the first protective layer may be integral over an entire surface of the upper substrate.

According to the present embodiment, the first display element, the second display element, and the third display element may include a first pixel electrode, a second pixel electrode, and a third pixel electrode, respectively, an opposite electrode corresponding to the first pixel electrode, the second pixel electrode, and the third pixel electrode, and an intermediate layer between each of the first pixel electrode, the second pixel electrode, and the third pixel electrode and the opposite electrode and including a first-color emission layer emitting light having a wavelength in a first wavelength band.

Other aspects, features, and advantages other than those described above will now become apparent from the following drawings, claims, and the detailed description of the disclosure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

The above and other aspects, features, and advantages of certain embodiments of the disclosure will be more apparent from the following description taken in conjunction with the accompanying drawings, in which.

DETAILED DESCRIPTION

Figure 1:
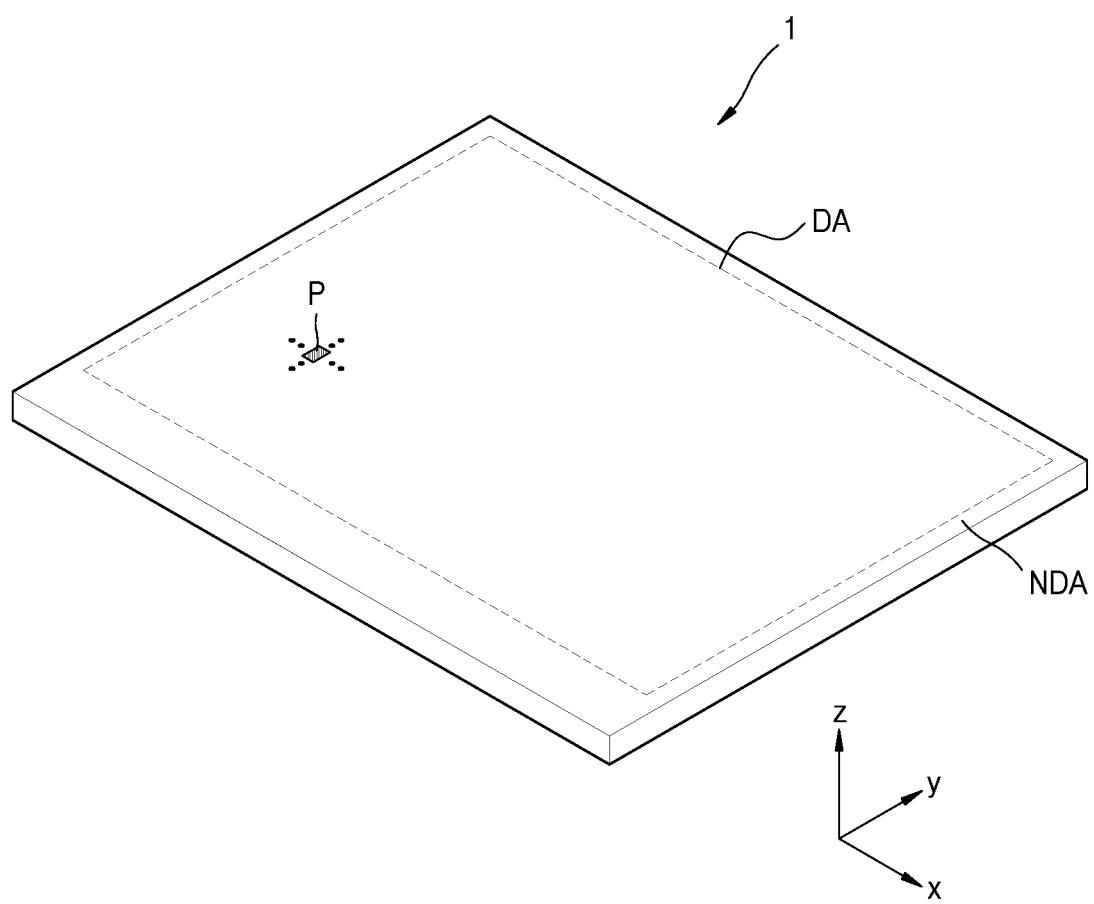
FIG. 1 is a schematic perspective view illustrating a portion of a display apparatus according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. When an exemplary embodiment may be implemented differently, a specific process order may be performed differently from the described order. For example, two consecutively described processes may be performed substantially at the same time or performed in an order opposite to the described order. Also, like reference numerals denote like elements.

Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above"

the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the inventive concepts allow for various changes and numerous embodiments, particular embodiments will be illustrated in the drawings and described in detail in the written description. Effects and features of the inventive concepts and methods of achieving the same will be apparent with reference to embodiments and drawings described below in detail. The inventive concepts may, however, be embodied in many different forms and should not be construed as being limited to the exemplary embodiments set forth herein.

The disclosure will now be described more fully with reference to the accompanying drawings, in which embodiments of the disclosure are illustrated. Like reference numerals in the drawings denote like elements, and thus their description will be omitted.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the inventive concepts, and are not intended to preclude the possibility that one or more other features or elements may exist or may be added.

It will be understood that when a layer, region, or component is referred to as being formed on another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the disclosure, "A and/or B" may include "A", "B", or "A and B". In addition, "at least one of A and B" may include "A", "B", or "A and B".

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the inventive concepts, "pixel" refers to "sub-pixels" that emit light of different colors from each other. For example, each pixel may be one of a blue (B) sub-pixel, a green (G) sub-pixel, and a red (R) sub-pixel.

Hereinafter, embodiments of the inventive concepts will be described in detail below with reference to the accompanying drawings.

FIG. 1 is a schematic perspective view of a portion illustrating a display apparatus 1 according to an embodiment.

As illustrated in FIG. 1, the display apparatus 1 according to an embodiment has a display area DA which emits light and a non-display area NDA which does not emit light. A lower substrate 100 may include the display area DA and the non-display area NDA.

Although the display apparatus 1 in which the display area DA has a rectangular shape is illustrated in FIG. 1, the shape of the display area DA may include an arbitrary shape such as a circular shape, an oval shape, a polygonal shape, or the like.

Hereinafter, the display apparatus 1 according to an embodiment is described as an organic light-emitting display apparatus as an example, but is not limited thereto. The display apparatus 1 may be an inorganic light-emitting display apparatus, a quantum dot light-emitting display apparatus, or the like. For example, an emission layer of a display element in the display apparatus 1 may include an organic material, an inorganic material, a quantum dot, an organic material and a quantum dot, an inorganic material and a quantum dot, or an organic material and an inorganic material and a quantum dot.

Pixels P may be located in the display area DA at a point where a scan line (not illustrated) extending in a y-axis direction and a data line (not illustrated) extending in an x-axis direction intersect. Each pixel P may include a pixel circuit connected to a scan line and a data line and an organic light-emitting diode as a first display element through a third display element connected to the pixel circuit.

Figure 2:
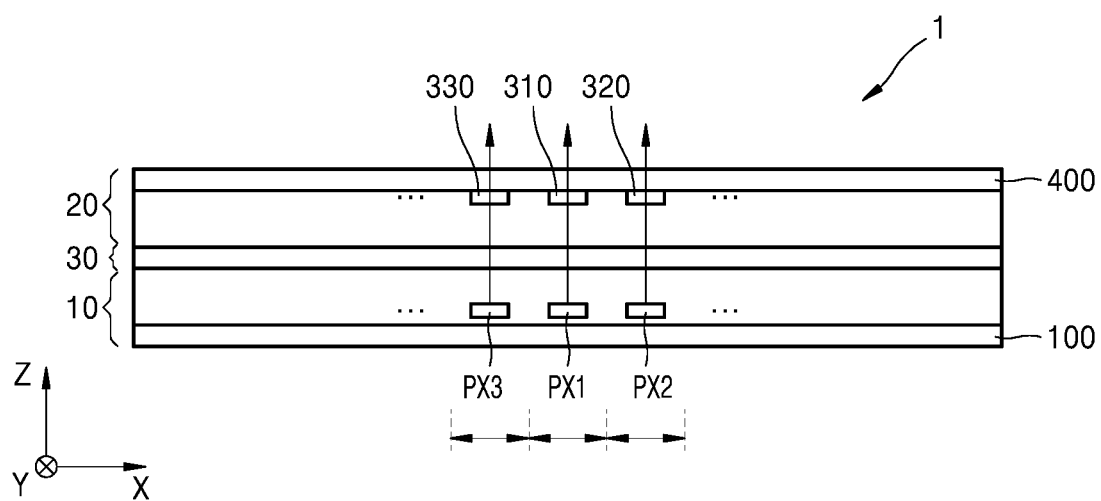
FIG. 2 is a schematic cross-sectional view of a portion of the display apparatus of FIG. 1.

FIG. 2 is a schematic cross-sectional view of a portion of the display apparatus 1 of FIG. 1.

As illustrated in FIG. 2, the display apparatus 1 according to an embodiment may have a display unit 10 and a color filter unit 20.

The display unit 10 includes the lower substrate 100. A first pixel PX1 through a third pixel PX3 may be arranged on the lower substrate 100 of the display unit 10. Each of the first pixel PX1 through the third pixel PX3 may be a pixel emitting light of a different color form each other on the lower substrate 100. For example, the first pixel PX1 may emit light of a first color (for example, blue), a second pixel PX2 may emit light of a second color (for example, green), and the third pixel PX3 may emit light of a third color (for example, red). To this end, the first pixel PX1 may include a first display element, the second pixel PX2 may include a second display element, and the third pixel PX3 may include a third display element.

The color filter unit 20 includes an upper substrate 400. A first color filter unit 310 through a third color filter unit 330 may be located on a first surface which is a lower surface of the upper substrate 400 of the color filter unit 20.

The color filter unit 20 may be separately manufactured by directly forming the first through third filter units 310, 320, and 330 on the first surface which is the lower surface of the upper substrate 400. At this time, a direction in which the upper substrate 400 is arranged in an operation of manufacturing the color filter unit 20 is not limited. In other words, the color filter unit 20 may be manufactured by forming the first through third filter units 310, 320, and 330 on the first surface in a state in which the first surface, which is the lower surface of the upper substrate 400, is arranged to face down (to face a −z-axis direction), or may be manufactured by forming the first through third filter units 310, 320, and 330 on the first surface in a state in which the first surface, which is the lower surface of the upper substrate 400, is arranged to face upward (to face a +z-axis direction).

Detailed descriptions with respect to structures of the display unit 10 and the color filter unit 20 will be described below with reference to FIGS. 4 to 13.

The display apparatus 1 may be manufactured by bonding the display unit 10 and the color filter unit 20 such that each of the first through third color filter units 310, 320, and 330 corresponds to the first pixel PX1 through the third pixel PX3. At this time, the color filter unit 20 may be arranged above the display unit 10. In detail, the color filter unit 20 may be arranged such that the first color filter unit 310 through the third color filter unit 330 overlap and are located above the first display element through the third display element of the display unit 10.

In an embodiment, the display apparatus 1 may further include an adhesive layer 30 arranged between the display unit 10 and the color filter unit 20 and configured to assist the bonding of the display unit 10 and the color filter unit 20. For example, the adhesive layer 30 may include an optical clear adhesive (OCA), but is not limited thereto. In addition, the adhesive layer 30 may include a filler (not illustrated). The filler may be located between the display unit 10 and the color filter unit 20 and act as a buffer against external pressure or the like. The filler may include an organic material such as methyl silicone, phenyl silicone, polyimide, or the like, a urethane resin, an epoxy resin, an acrylic resin, which are an organic sealant, or silicon or the like which is an inorganic sealant, but is not limited thereto. In an optional embodiment, the adhesive layer 30 may be omitted.

Figure 3:
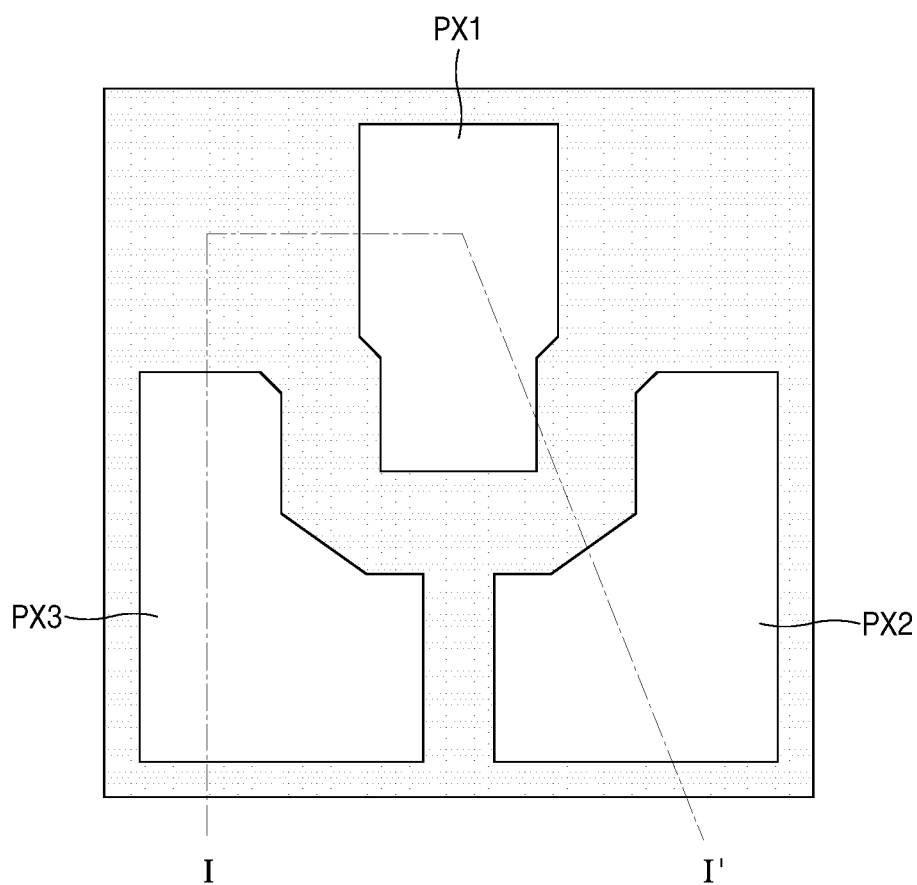
FIG. 3 is a schematic layout diagram of an arrangement of pixels in the display apparatus of FIG. 1.

FIG. 3 is a schematic layout diagram of an arrangement of pixels in the display apparatus 1 of FIG. 1.

The display apparatus 1 according to an embodiment may include one or more pixels in a unit pixel area. The "unit pixel area" is an area in which a pixel set including one or more pixels is arranged, and may be repeatedly or periodically located in the display area DA. The size, number, shape, and arrangement of the unit pixel areas, and the size, number, shape, and arrangement of pixels located in the unit pixel areas may be variously modified and are not limited.

As a particular example, as illustrated in FIG. 3, the display apparatus 1 may include a plurality of unit pixel areas, and a pixel set including the first pixel PX1 through the third pixel PX3 may be located in each of the plurality of unit pixel areas. This is only an example, and the display apparatus 1 may include more or fewer pixels. The first display element through the third display element of the display unit 10 and the first color filter unit 310 through the third color filter unit 330 of the color filter unit 20 may correspond to be included in the first pixel PX1 through the third pixel PX3. The first display element through the third display element corresponding to the first color filter unit 310 through the third color filter unit 330 refers to that the first display element through the third display element overlap the first color filter unit 310 through the third color filter unit 330 when viewing in a direction (a z-axis direction) perpendicular to the lower substrate 100 or the upper substrate 400. In detail, when viewing in the direction (the z-axis direction) perpendicular to the lower substrate 100 or the upper substrate 400, the first color filter unit 310 may overlap a first pixel electrode 211 of the first display element, the second color filter unit 320 may overlap a second pixel electrode 213 of the second display element, and the third color filter unit 330 may overlap a third pixel electrode 215 of the third display element.

Although FIGS. 2 to 13 illustrate that the first pixel PX1 through the third pixel PX3 are adjacent to each other, the inventive concepts are not limited thereto. In other words, other components such as other lines may be arranged between the first pixel PX1 through third pixel PX3. Accordingly, for example, the first pixel PX1 and the second pixel PX2 may not be pixels located adjacent to each other. In addition, cross-sections of the first pixel PX1 through the third pixel PX3 in FIGS. 2 to 13 may not be cross-sections in the same direction.

Figure 4:
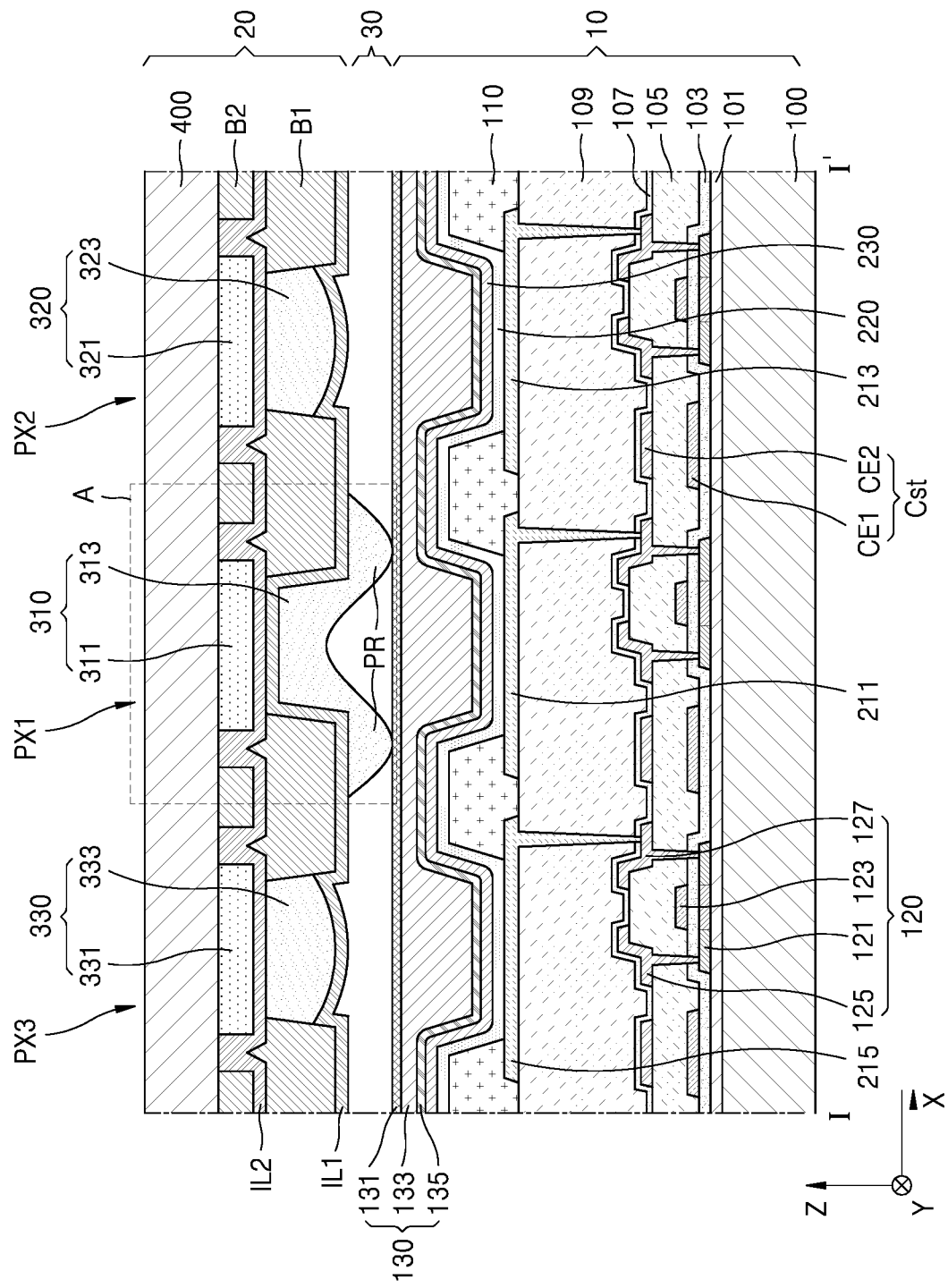
FIG. 4 is a cross-sectional view of the display apparatus taken along line I-I' of FIG. 3.

FIG. 4 is a cross-sectional view of the display apparatus 1 taken along line I-I' of FIG. 3.

The display apparatus 1 according to an embodiment may include the display unit 10, the color filter unit 20, and the adhesive layer 30.

The display unit 10 includes the lower substrate 100. The lower substrate 100 may include a glass material, a metal material, a ceramic material, or a material having a flexible or bendable characteristic. When the lower substrate 100 has a flexible or bendable characteristic, the lower substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate. The lower substrate 100 may have a single-layer or multi-layer structure including the above-stated materials. In a case of a multi-layer structure, the lower substrate 100 may include a multi-layer structure including two layers including a polymer resin and a barrier layer including an inorganic material (silicon oxide, silicon nitride, silicon oxynitride, or the like) arranged between the two layers, and various modifications may be made.

A buffer layer 101 may be formed on the lower substrate 100. The buffer layer 101 may include an inorganic material such as silicon oxide, silicon nitride, and/or silicon oxynitride, or the like, and may include a single-layer or multi-layer structure. The buffer layer 101 may increase the smoothness of an upper surface of the lower substrate 100, or may prevent or minimize penetration of impurities or moisture from the outside of the lower substrate 100 or the like into a semiconductor layer 121 of a thin-film transistor 120.

A pixel circuit may be located on the buffer layer 101, and a display element layer including the first display element through the third display element which are electrically connected to the pixel circuit may be located on the pixel circuit. In addition, the pixel circuit may include the thin-film transistor 120 and a capacitor Cst. The first display element through the third display element being electrically connected to the pixel circuit may be understood as the first through third pixel electrodes 211, 213, and 215 of the first display element through the third display element being electrically connected to the thin-film transistor 120.

The thin-film transistor 120 may include the semiconductor layer 121 including amorphous silicon, polycrystalline silicon, or an organic semiconductor material, a gate electrode 123, a source electrode 125, and a drain electrode 127.

The semiconductor layer 121 may be located on the buffer layer 101 and may include amorphous silicon or polysilicon. As a particular example, the semiconductor layer 121 may include an oxide of at least one or more materials selected from a group including indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In addition, the semiconductor layer 121 may include a zinc-oxide-based material, and may include Zn oxide, In—Zn oxide, Ga—In—Zn oxide, or the like. In addition, the semiconductor layer 121 may include an In—Ga—Zn—O (IGZO), In—Sn—Zn—O (ITZO), or In—Ga—Sn—Zn—O (IGTZO) semiconductor, which include a metal such as In, Ga, and Sn in ZnO. The semiconductor layer 121 may include a channel area and a source area and a drain area which are respectively arranged on both sides of the channel area.

The gate electrode 123 may be located above the semiconductor layer 121 to overlap at least a portion of the semiconductor layer 121. The gate electrode 123 may include various conductive materials including molybdenum (Mo), Al, copper (Cu), Ti, or the like, and may have various layer structures. For example, the gate electrode 123 may include a Mo layer and an Al layer, or may have a multi-layer structure of Mo/Al/Mo.

The source electrode 125 and the drain electrode 127 may also include various conductive materials including Mo, Al, Cu, Ti, or the like, and may have various layer structures. For example, the source electrode 125 and the drain electrode 127 may include a Ti layer and an Al layer, or may include a multi-layer structure of Ti/Al/Ti. The source electrode 125 and the drain electrode 127 may be connected to the source area or the drain area of the semiconductor layer 121 through a contact hole.

To secure insulation between the semiconductor layer 121 and the gate electrode 123, a gate insulating layer 103 including an inorganic material, such as silicon oxide, silicon nitride, and/or silicon oxynitride, or the like, may be arranged between the semiconductor layer 121 and the gate electrode 123. In addition, a first interlayer insulating layer 105 may be located on the gate electrode 123 as a layer having a certain dielectric constant, and the first interlayer insulating layer 105 may be an insulating layer including an inorganic material such as silicon oxide, silicon nitride, and/or silicon oxynitride, or the like. The source electrode 125 and the drain electrode 127 may be located on the first interlayer insulating layer 105. An insulating layer (film) including the inorganic material may be formed by chemical vapor deposition (CVD), atomic layer deposition (ALD), or the like. The above descriptions may be similarly applied to the embodiments and modifications examples thereof to be described below.

The capacitor Cst may include a first electrode CE1 and a second electrode CE2. The first electrode CE1 overlaps the second electrode CE2 with the first interlayer insulating layer 105 therebetween to form a capacitance. In this case, the first interlayer insulating layer 105 serves as a dielectric layer of the capacitor Cst.

The first electrode CE1 may be located on the same layer as the gate electrode 123. The first electrode CE1 and the gate electrode 123 may include the same material and may include, for example, various conductive materials including Mo, Al, Cu, Ti, or the like, and may have various layer structures (for example, a multi-layer structure of Mo/Al/Mo, or the like). The second electrode CE2 may be located on the same layer as the source electrode 125 and the drain electrode 127. The second electrode CE2 may include the same material as the source electrode 125 and the drain electrode 127 and may include, for example, various conductive materials including Mo, Al, Cu, Ti, or the like, and may have various layer structures (for example, a multi-layer structure of Ti/Al/Ti).

A planarization layer 109 may be located on the thin-film transistor 120. When an organic light-emitting diode is located on the thin-film transistor 120 as an example of the first display element through the third display element, the planarization layer 109 may substantially planarize an upper portion of a protective film covering the thin-film transistor 120. The planarization layer 109 may include, for example, benzocyclobutene (BCB), polyimide, hexamethyldisiloxane (HDMSO), a general commercial polymer such as poly (methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, and a mixture thereof. For convenience, the planarization layer 109 is illustrated as a single layer in FIGS. 4, 12, and 13, but may include a multi-layer, and various modifications may be made.

The first display element through the third display element may be located on the planarization layer 109. The first display element through the third display element may be an organic light-emitting diode having first through third pixel electrodes 211, 213, and 215, an opposite electrode 230, and an intermediate layer 220 arranged between the first through third pixel electrodes 211, 213, and 215 and the opposite electrode 230 and including an emission layer.

As an embodiment, the first display element through the third display element may include the first pixel electrode 211 through the third pixel electrode 215, the opposite electrode 230 corresponding to the first pixel electrode 211 through the third pixel electrode 215, and the intermediate layer 220 arranged between the first pixel electrode 211 through the third pixel electrode 215 and opposite electrode 230. In addition, the intermediate layer 220 may include a first-color emission layer that emits light having a wavelength in a first wavelength band. For example, the first wavelength band may be about 450 nm to about 495 nm, and the first color may be blue, but are not limited thereto.

The first through third pixel electrodes 211, 213, and 215 of the first display element through the third display element may be electrically connected to the thin-film transistor 120 by contacting any one of the source electrode 125 and the display element through an opening portion (contact hole) formed in the planarization layer 109 or the like. The first through third pixel electrodes 211, 213, and 215 may be (semi)transparent electrodes or reflective electrodes. In some embodiments, the first through third pixel electrodes 211, 213, and 215 may include a reflective layer including silver (Ag), magnesium (Mg), Al, platinum (Pt), palladium (Pd), gold (Au), nickel (Ni), neodymium (Nd), iridium (Ir), chrome (Cr), or a compound thereof, and a transparent or semi-transparent electrode layer on the reflective layer. The transparent or semi-transparent electrode layer may include at least one selected from a group including indium tin oxide (ITO), indium zinc oxide (IZO), zinc oxide (ZnO), indium oxide ($In_2O_3$) indium gallium oxide (IGO), and aluminum zinc oxide (AZO). In addition, the first through third pixel electrodes 211, 213, and 215 may have a stacked structure of ITO/Ag/ITO.

A pixel defining film 110 may be located on the planarization layer 109. The pixel defining film 110 may define a pixel (or an emission area) by having openings corresponding to each sub-pixel. At this time, the openings may be formed to expose at least a portion of central portions of the first through third pixel electrodes 211, 213, and 215. For example, the pixel defining film 110 may be located between the first display element and the second display element, between the second display element and the third display element, and between the first display element and the third display element.

The pixel defining film 110 may prevent an arc or the like from being generated at edges of the first through third pixel electrodes 211, 213, and 215 by increasing a distance between the edges of the first through third pixel electrodes 211, 213, and 215 and the opposite electrode 230 above the first through third pixel electrodes 211, 213, and 215. The pixel defining film 110 may include one or more organic insulating materials selected from a group including polyamidem polyimide, an arcrylic resin, BCB, and a phenol resin, and may be formed by a spin coating method or the like.

The intermediate layer 220 of the first display element through the third display element may include a low-molecular-weight material or a polymer material. When the intermediate layer 220 includes a low-molecular-weight material, the intermediate layer 220 may include a structure in which a hole injection layer (HIL), a hole transport layer (HTL), an emission layer (EML), an electron transport layer (ETL), an electron injection layer (EIL), or the like are stacked in a single or complex structure, and may be formed by a method of vacuum deposition. When the intermediate layer 220 includes a polymer material, the intermediate layer 220 may have a structure including a HTL and an EML. The HTL may include poly(3,4-ethylenedioxythiophene) (PEDOT), and the EML may include a polymer material such as poly(p-phenylene vinylene) (PPV), polyfluorene, or the like. The intermediate layer 220 may be formed by a screen printing method, an inkjet printing method, a vapor deposition method, a laser induced thermal imaging (LITI) method, or the like. The intermediate layer 220 is not limited thereto and may have various structures.

As described above, the intermediate layer 220 may include a single layer over the first pixel electrode 211 of the first display element extending to third pixel electrode 215 of the third display element, but according to additional embodiments, the intermediate layer 220 may include a layer patterned to correspond to each of the first pixel electrode 211 through the third pixel electrode 215. In any case, the intermediate layer 220 includes the first-color emission layer. The first-color emission layer may be integral over the first pixel electrode 211 through the third pixel electrode 215, and according to additional embodiments, the first-color emission layer may be patterned to correspond to each of the first pixel electrode 211 through the third pixel electrode 215. The first-color emission layer may emit light having a wavelength in the first wavelength band, for example, may emit light having a wavelength in about 450 nm to about 495 nm.

The opposite electrode 230 of the first display element through the third display element is located above a display area. As a particular example, the opposite electrode 230 may include a single layer to cover an entire surface of the display area and may be arranged above the display area. In other words, the opposite electrode 230 may be formed integrally over a plurality of first display elements through third display elements to correspond to a plurality of first through third pixel electrodes 211, 213, and 215. At this time, the opposite electrode 230 may be formed to cover the display area and extend to a portion of a non-display area outside the display area. As another example, the opposite electrode 230 may be formed by being patterned to correspond to each of the plurality of first through third pixel electrodes 211, 213, and 215.

The opposite electrode 230 may be a transparent electrode or a reflective electrode. In some embodiments, the opposite electrode 230 may be a transparent or a semi-transparent electrode, and include a metal thin film having a small work function and including lithium (Li), calcium (Ca), lithium fluoride (LiF)/Ca, LiF/Al, Al, Ag, Mg, and a compound thereof. In addition to the metal thin film, a transparent conductive oxide (TCO) film such as ITO, IZO, ZnO, or $In_2O_3$ may be further included.

Because the organic light-emitting diode may be easily damaged by moisture or oxygen or the like from the outside, the organic light-emitting diode may be covered and protected by an encapsulation layer 130. The encapsulation layer 130 includes at least one organic encapsulation layer and at least one inorganic encapsulation layer. For example, the encapsulation layer 130 may include a first inorganic encapsulation layer 131, an organic encapsulation layer 133, and a second inorganic encapsulation layer 135.

The first inorganic encapsulation layer 131 may cover the opposite electrode 230 and may include silicon oxide, silicon nitride, and/or silicon oxynitride, or the like. Other layers (not illustrated) such as a capping layer or the like may be located between the first inorganic encapsulation layer 131 and the opposite electrode 230. Because the first inorganic encapsulation layer 131 is formed along a structure thereunder, an upper surface of the first inorganic encapsulation layer 131 is not formed flat. Therefore, the organic encapsulation layer 133 is formed to cover the first inorganic encapsulation layer 131. The organic encapsulation layer 133 has an approximately flat upper surface. Accordingly, the encapsulation layer 130 may have a flat upper surface by including the organic encapsulation layer 133. The inorganic encapsulation layer 133 may include one or more materials selected from a group including polyethylene terephthalate, polyethylene naphthalate, polycarbonate, polyimide, polyethylene sulfonate, polyoxymethylene, polyarylate, and hexamethyldisiloxane. The second inorganic encapsulation layer 135 may cover the organic encapsulation layer 133 and may include silicon oxide, silicon nitride, silicon oxynitride, silicon oxynitride, or the like.

According to the above-stated multi-layer structure, even when cracks occur in the encapsulation layer 130, the encapsulation layer 130 may prevent the cracks from connecting between the first inorganic encapsulation layer 131 and the organic encapsulation layer 133 or between the organic encapsulation layer 133 and the second inorganic encapsulation layer 135. Accordingly, the formation of a path, through which external moisture or oxygen, or the like may penetrate, may be prevented or minimized.

The color filter unit 20 includes the upper substrate 400. The first color filter unit 310 through the third color filter unit 330 which correspond to the first pixel PX1 through the third pixel PX3 are located on a first surface of the upper substrate 400. In this case, the "first surface" refers to a surface (lower surface) in a direction of the display unit 10 when the color filter unit 20 is arranged above the display unit 10. The first color filter unit 310 through the third color filter unit 330 may be located to overlap the first pixel electrode 211 or an emission layer of the first display element through the third display element or an emission layer of the third pixel electrode 215, when viewing in a direction (z-axis direction) perpendicular to the lower substrate 100 of the display unit 10 or the upper substrate 400 of the color filter unit 20. Accordingly, the first color filter unit 310 through the third color filter unit 330 may filter light emitted from each of the first display element through the third display element.

The first color filter unit 310 through the third color filter unit 330 may include a first-color color filter layer 311 through a third-color color filter layer 331 located on the first surface, which is the lower surface of the upper substrate 400, a transparent layer 313 located above the first-color color filter layer 311, a second color quantum dot layer 323 located above the second-color color filter layer 321, and a third color quantum dot layer 333 located above the third-color color filter layer 331.

In detail, the first color filter unit 310 may include the first-color color filter layer 311 and the transparent layer 313, the second color filter unit 320 may include the second-color color filter layer 321 and the second color quantum dot layer 323, and the third color filter unit 330 may include the third-color color filter layer 331 and the third color quantum dot layer 333.

The first-color color filter layer 311 may only allow light having a wavelength in about 450 nm to about 495 nm to pass through, the second-color color filter layer 321 may only allow light having a wavelength in about 495 nm to about 570 nm to pass through, and the third-color color filter layer 331 may only allow light having a wavelength in about 630 nm to about 780 nm to pass through. The first-color color filter layer 311 through the third-color color filter layer 331 may reduce external light reflection in the display apparatus 1.

For example, when external light reaches the first-color color filter layer 311, only light having a predetermined wavelength as described above passes through the first-color color filter layer 311, and light of other wavelengths is absorbed by the first-color color filter layer 311. Accordingly, only light having a predetermined wavelength as described above among the external light incident on the display apparatus 1 passes through the first-color color filter layer 311, and a portion of the light passing through the first-color color filter layer 311 is reflected by the opposite electrode 230 or the first pixel electrode 211 of the first display element thereunder and is emitted to the outside again. As a result, because only a portion of external light incident on a place where the first pixel PX1 is located is reflected to the outside, the first-color color filter layer 311 may reduce the external light reflection. The above descriptions may be applied to the second-color color filter layer 321 and the third-color color filter layer 331 in the same way.

The second color quantum dot layer 323 may convert light having a wavelength in the first wavelength band generated in the intermediate layer 220 of the second display element into light having a wavelength in a second wavelength band. For example, when light having a wavelength in about 450 nm to about 495 nm is generated in the intermediate layer 220 of the second display element, the second color quantum dot layer 323 may convert the light into light having a wavelength in about 495 nm to about 570 nm. Accordingly, the light having a wavelength in about 495 nm to about 570 nm is emitted from the second pixel PX2 to the outside.

The third color quantum dot layer 333 may convert light having a wavelength in the first wavelength band generated in the intermediate layer 220 of the third display element into light having a wavelength in a third wavelength band. For example, when light having a wavelength in about 450 nm to about 495 nm is generated in the intermediate layer 220 of the third display element, the third color quantum dot layer 333 may convert the light into light having a wavelength in about 630 nm to about 780 nm. Accordingly, the light having a wavelength in about 630 nm to about 780 nm is emitted from the third pixel PX3 to the outside.

Each of the second color quantum dot layer 323 and the third color quantum dot layer 333 may have a shape in which quantum dots are dispersed in a resin.

The size of the quantum dots may be several nanometers, and the wavelength of light after conversion is changed according to the particle size of the quantum dots. In other words, the quantum dots may control the color of light emitted according to the particle size of the quantum dots, and accordingly, the quantum dots may have various emission colors such as blue, red, green, or the like. The particle size of the quantum dots may have a full width of half maximum (FWHM) of an emission wavelength spectrum of about 45 nm or less, preferably about 40 nm or less, and more preferably about 30 nm or less. Color purity and color reproducibility may be improved in the above range. In addition, as light emitted through the quantum dots is emitted in all directions, a viewing angle of light may be improved. In addition, a form of the quantum dots may be a form that is generally used in the art and is not particularly limited, and more particularly, the form of the quantum dots may include a sphere shape, a pyramid shape, a multi-arm shape, or cubic nanoparticles, nanotubes, nanowires, nanofibers, nanoplatelets, or the like. In addition, the quantum dots may include a semiconductor material such as cadium sulfide (CdS), cadium telluride (CdTe), zinc sulfide (AnS), indium phosphide (InP), or the like.

The resin included in the second color quantum dot layer 323 and the third color quantum dot layer 333 may be any material as along as being a transparent material. For example, a polymer resin such as a silicone resin, an epoxy resin, acrylic, BCB, HMDSO, or the like may be used as materials forming the second color quantum dot layer 323 and the third color quantum dot layer 333.

The first color filter unit 310 may not include a quantum dot layer, and may include a transparent layer 313. For example, the display unit 10 may include an intermediate layer 220 arranged between the first pixel electrode 211 through the third pixel electrode 215 of the first display element through the third display element and the opposite electrode 230 and including a first-color emission layer emitting light having a wavelength in the first wavelength band. In this case, light having a wavelength in the first wavelength band generated in the intermediate layer 220 is emitted from the first pixel PX1 to the outside without wavelength conversion. Accordingly, because a quantum dot layer may not be used in the first pixel PX1, the first color filter unit 310 may include the transparent layer 313 including a transparent resin instead of the quantum dot layer.

As an embodiment, the transparent layer 313 may have one or more protrusions PR in a direction away from the first surface of the upper substrate 400. The protrusions PR of the transparent layer 313 may serve as a support when the display unit 10 and the color filter unit 20 are bonded. That is, the protrusions PR of the transparent layer 313 may maintain and support a distance between the display unit 10 and the color filter unit 20 over a certain distance. To this end, the protrusions PR may be formed such that an end portion thereof is located in a position most far away from the first surface of the upper substrate 400 and may contact an uppermost layer of the display unit 10 when the color filter unit 20 is arranged on the display unit 10.

Preferably, the protrusions PR of the transparent layer 313 have a small brittleness and a certain level of elasticity so as not to be destroyed when an external force is applied. For example, the transparent layer 313 may include a polymer resin such as a silicone resin, an epoxy resin, acrylic, BCB, HMDSO, or the like. In an optional embodiment, the transparent layer 313 may include scattering particles, and a detailed description thereof will be described below with reference to FIG. 5.

Preventing the second color quantum dot layer 323 and the third color quantum dot layer 333 from being damaged in a manufacturing operation or a use operation after the manufacturing operation is desired according to embodiments described herein. To this end, the color filter unit 20 may further include a first protective layer IL1 arranged between the first-color color filter layer 311 and the transparent layer 313 and covering an upper surface of the second color quantum dot layer 323 and an upper surface of the third color quantum dot layer 333. In other words, the first protective layer IL1 may be formed to be arranged between the first-color color filter layer 311 and the transparent layer 313 and cover a surface of the second color quantum dot layer 323 in a direction of the second display element and a surface of the third color quantum dot layer 333 in a direction of the third display element.

When the quantum dots in the second color quantum dot layer 323 are damaged, the second color quantum dot layer 323 may not be able to convert light in the first wavelength band into light in the second wavelength band. Accordingly, preventing the quantum dots in the second color quantum dot layer 323 from being damaged by out-gas generated from the second-color color filter layer 321 is desired according to embodiments described herein. Similarly, when the quantum dots in the third color quantum dot layer 333 are damaged, the third color quantum dot layer may not be able to convert light in the first wavelength band into light in the third wavelength band. Accordingly, preventing the quantum dots in the third color quantum dot layer 333 from being damaged by out-gas generated from the third-color color filter layer 331 is desired according to embodiments described herein. To this end, the first protective layer IL1 may be arranged between the second-color color filter layer 321 and the second color quantum dot layer 323, and may also be arranged between the third-color color filter layer 331 and the third color quantum dot layer 333.

The first protective layer IL1 may include an inorganic material such as silicon oxide, silicon nitride, or silicon oxynitride to block gas passage. In addition, the first protective layer IL1 may include an organic material including one or more materials selected from a group including polyethylene terephthalate, polyethylene naphthalate, polycarbonate, polyimide, polyethylene sulfonate, polyoxymethylene, polyarylate, and HMDSO.

Also, the first protective layer IL1 may be integral over an entire surface of the upper substrate 400.

In the display apparatus 1 according to the present embodiment, light in the first wavelength band is emitted from the first pixel PX1 to the outside, light in the second wavelength band is emitted from the second pixel PX2 to the outside, and light in the third wavelength band is emitted from the third pixel PX3 to the outside. Accordingly, the display apparatus 1 according to the present embodiment may display a full color image.

Figure 5:
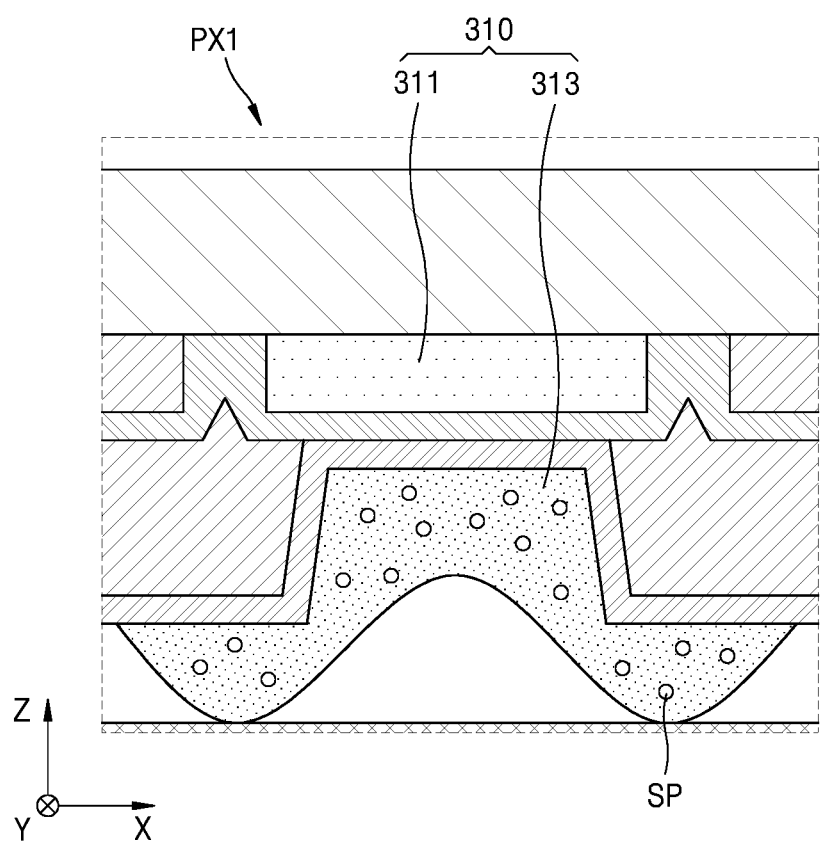
FIG. 5 is a schematic cross-sectional view of the display apparatus of an example of portion A of FIG. 4.

FIG. 5 is a schematic cross-sectional view of the display apparatus 1 of an example of portion A of FIG. 4.

As illustrated in FIG. 5, the transparent layer 313 included in the first color filter unit 310 of the color filter unit 20 according to an embodiment may include scattering particles SP.

The scattering particles SP may reduce a brightness ratio of a front surface of light emitted from a pixel electrode to a side surface of light emitted from a pixel. In each pixel, as light generated from a pixel electrode passes through a filter unit to be emitted to the outside, the brightness of light with respect to the front surface is high and the brightness of light with respect to the side surface is relatively low, and thus a brightness ratio of light with respect to the front surface and the side surface is obtained. As a result, a decrease in performance of a display apparatus may occur, such as a reduced viewing angle, a wrong color coordinate, or the like. As the transparent layer 313 includes the scattering particles to allow light passing through the transparent layer 313 to be scattered by the scattering particles SP, the color filter unit 20 or the display apparatus 1 according to an embodiment may reduce a brightness ratio of light with respect to the front surface and the side surface.

For example, the scattering particles SP may be titanium oxide ($TiO_2$), metal particles, or the like. In addition, the transparent layer 313 may be a photosensitive polymer in which the scattering particles SP are dispersed. At this time, the photosensitive polymer may include an organic material having light transmittance, such as a silicon resin, an epoxy resin, or the like.

FIGS. 6 to 11 each illustrate a schematic cross-sectional view of a portion of an operation of manufacturing the color filter unit 20 included in the display apparatus 1 of FIG. 1.

Figure 6:
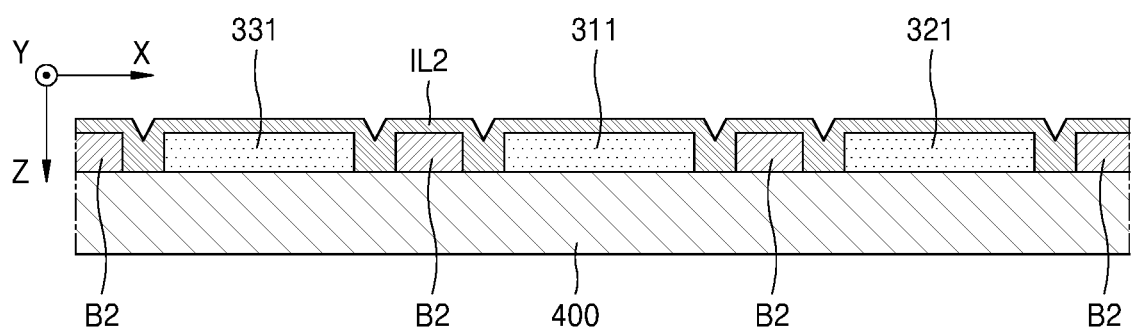
FIGS. 6, 7, 8, 9, 10, and 11 each illustrate a schematic cross-sectional view of a portion of an operation of manufacturing a color filter unit included in the display apparatus of FIG. 1.

As illustrated in FIG. 6, the first-color color filter layer 311 through the third-color color filter layer 331 are formed on the first surface of the upper substrate 400.

In particular, second partitions B2 are formed on the first surface of the upper substrate 400. The second partitions B2 may be arranged to be apart from each other on the first surface of the upper substrate 400 and may define a first color area through a third color area. In other words, the second partitions B2 define the first color area through the third color area in separation areas between adjacent second partitions B2, and the first color area through the third color area correspond to the first pixel PX1 through the third pixel PX3.

The second partitions B2 may be patterned to correspond to a non-emission area of the display unit 10 to serve as a light blocking layer when the display unit 10 and the color filter unit 20 are bonded. In other words, light may be emitted from a display element layer of the display unit 10 to the outside only through the first color area through the third color area, which are areas (hereinafter, separation areas) in which the second partitions B2 are not located.

The second partitions B2 may include a material (photoresist) that causes chemical changes when light is irradiated. For example, the second partitions B2 may include, as a negative-type photoresist, aromatic bisazide, methacrylic acid ester, cinnamic acid ester, or the like, and may include, as a positive-type photoresist, poly(methylmethacrylate), naphthoquinonediazide, polybutene-1-sulfone, or the like, but are not limited thereto. In addition, in an optional embodiment, the second partitions B2 may include a black matrix, a black pigment, a metal material, or the like to act as a light blocking layer, and may include a material having reflexibility, such as Al, Ag, or the like, to increase light efficiency.

The first-color color filter layer 311 through the third-color color filter layer 331 are formed between the second partitions B2 to correspond to the first pixel PX1 through the third pixel PX3. For example, the first-color through third-color color filter layers 311, 321, and 331 may be formed by an inkjet operation, but are not limited thereto.

A second protective layer IL2 may be formed on the first-color through third-color color filter layers 311, 321, and 331 to cover the second partitions B2 and the first-color through third-color color filter layers 311, 321, and 331. For example, the second protective layer IL2 may include a material such as silicon oxide, silicon nitride, silicon oxynitride, or the like, as an inorganic insulating material having light transmittance.

Figure 7:
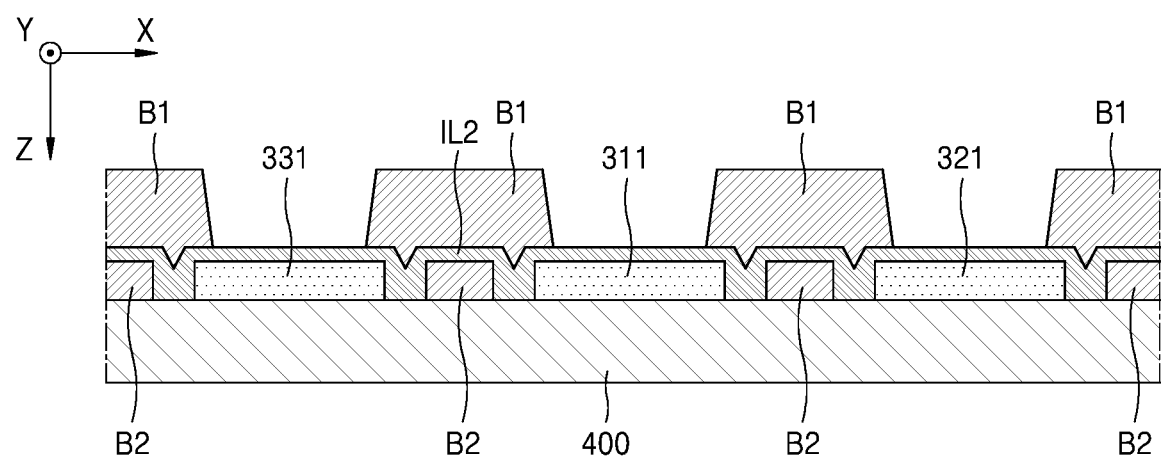

Subsequently, as illustrated in FIG. 7, first partitions B1 are formed on the second protective layer IL2 to correspond to the second partitions B2. In other words, the first partitions B1 is located on the second partitions B2 to overlap the second partitions B2 when viewing in a direction (z-axis direction) perpendicular to the upper substrate 400. In addition, the first partitions B1 may overlap a portion of adjacent color filter layers.

The first partitions B1 may include the same material as the second partitions B2. For example, the first partitions B1 may include, as a negative-type photoresist, aromatic bisazide, methacrylic acid ester, cinnamic acid ester, or the like, and may include, as a positive-type photoresist, poly(methylmethacrylate), naphthoquinonediazide, polybutene-1-sulfone, or the like.

Figure 8:
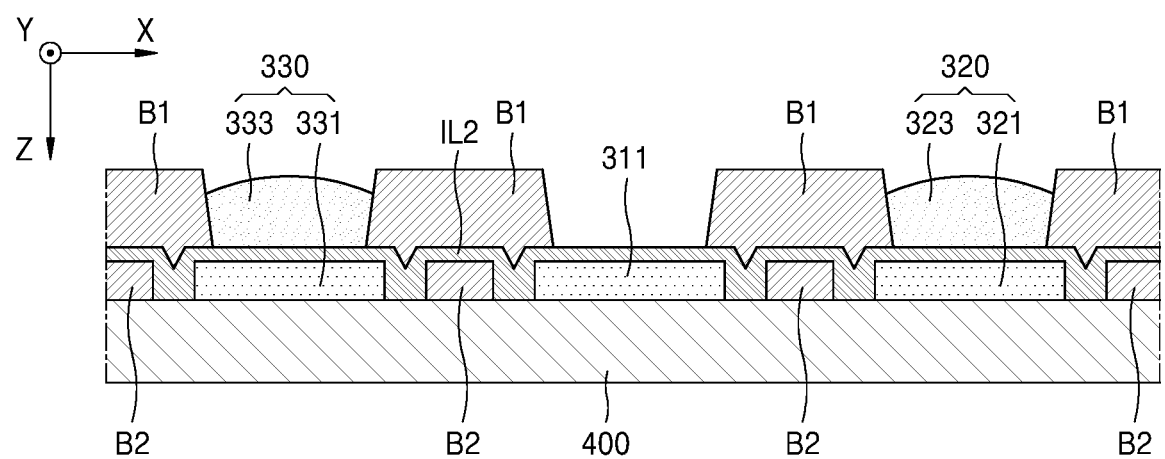

Then, as illustrated in FIG. 8, the second color through the third color quantum dot layers 323 and 333 are formed in separation areas between the first partitions B1 with respect to the second color area and the third color area. In other words, the second color quantum dot layer 323 is formed to overlap the second-color color filter layer 321 of the second color area, and the third color quantum dot layer 333 is formed to overlap the third-color color filter layer 331 of the third color area. For example, the second color through the third color quantum dot layers 323 and 333 may be formed by an inkjet operation, but are not limited thereto.

Figure 9:
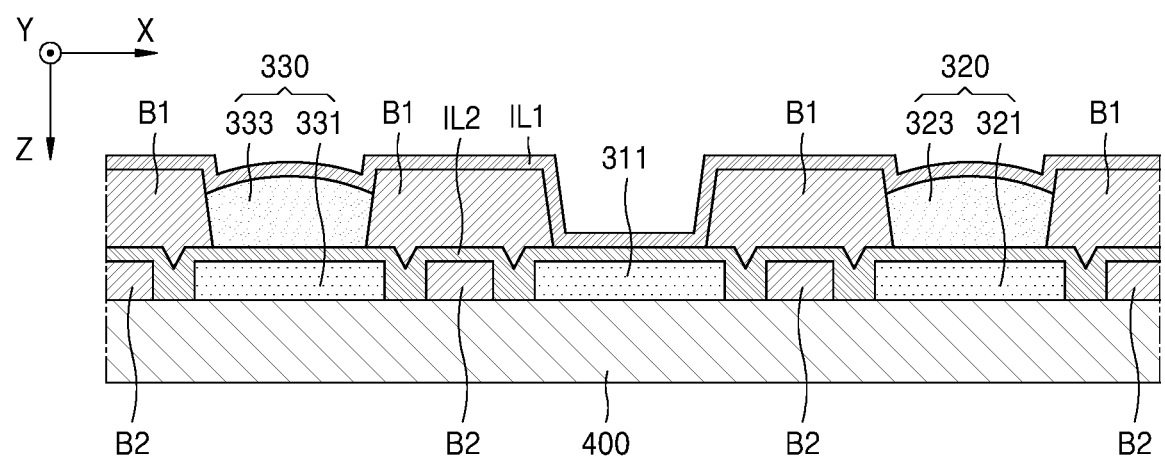

Next, as illustrated in FIG. 9, the first protective layer IL1 is formed as integral over the entire surface of the upper substrate 400 to cover the first partitions B1 and the second color through the third color quantum dot layers 323 and 333. At this time, the first protective layer IL1 is formed to contact the second protective layer IL2 in the first color area where a quantum dot layer is not formed. For example, the first protective layer IL1 may include a material such as silicon oxide, silicon nitride, silicon oxynitride, or the like, as an inorganic insulating material having light transmittance.

Figure 10:
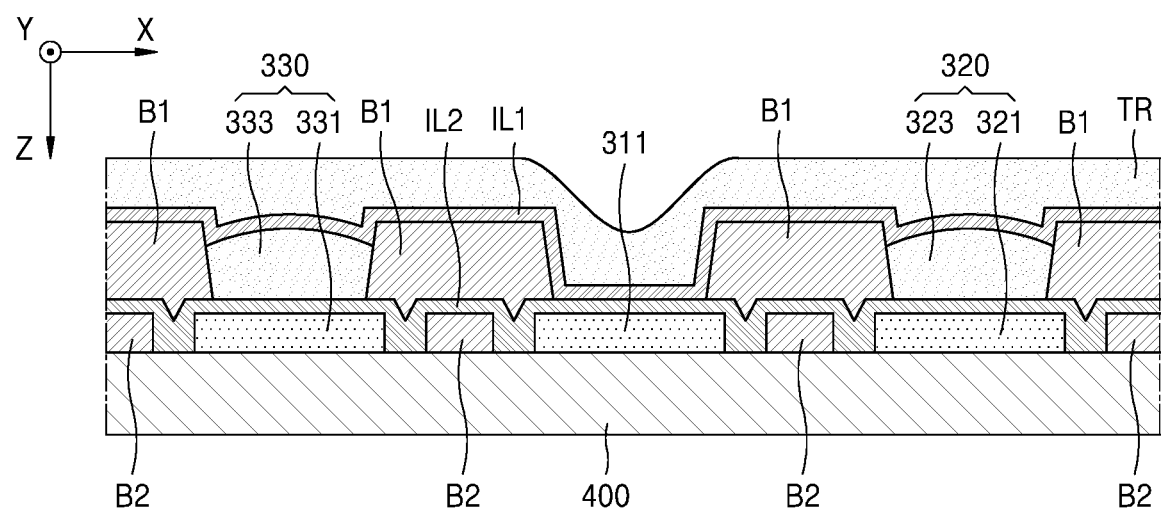

Subsequently, as illustrated in FIG. 10, a transparent material layer TR, which is a layer including a transparent material, is formed on the first protective layer IL1 over the entire surface of the upper substrate 400. In other words, the transparent layer 313 (illustrated in FIGS. 4, 12, and 13) may be formed by forming the transparent material layer TR including the transparent material over the entire surface of the upper substrate 400 and then patterning the transparent material layer by using a mask. As described above, the transparent layer 313 is formed separately from the second color quantum dot layer 323 through the third color quantum dot layer 333 using a mask operation instead of the inkjet operation, and thus, a defect rate such as color mixing defects or the like which may occur during the inkjet operation when forming the second color quantum dot layer 323 through the third color quantum dot layer 333 may be significantly reduced.

The transparent layer 313 may include an organic material such as a polymer resin, such as a silicone resin, an epoxy resin, acrylic, BCB, HMDSO, or the like. The organic material has a planarizing characteristic, and adjusting the flatness of the transparent material layer is desired such that the transparent layer 313 includes protrusions PR. For example, the composition ratio, viscosity, or the like of materials included in the transparent material layer may be adjusted, but are not limited thereto. In addition, as described above, the transparent material may include the scattering materials SP.

Figure 11:
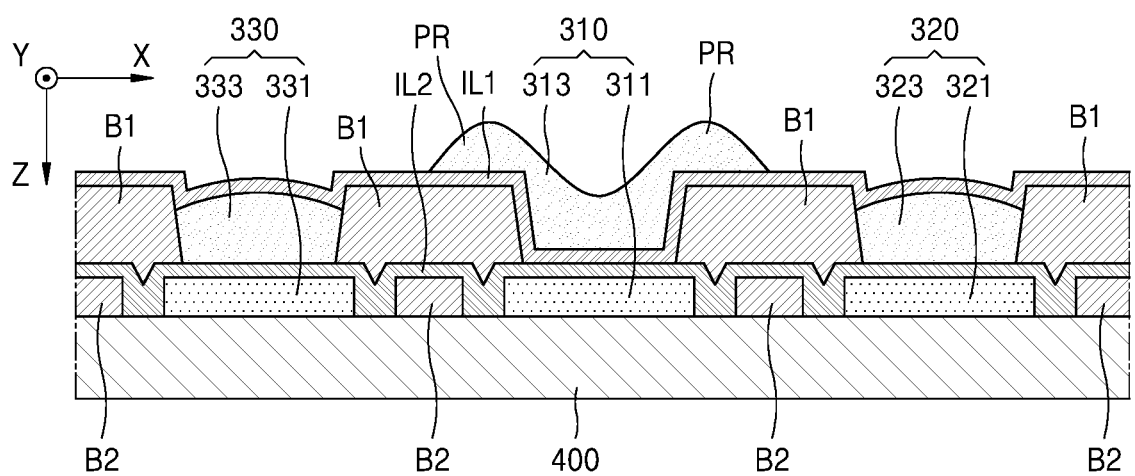

Next, as illustrated in FIG. 11, the transparent material layer TR is patterned into the transparent layer 313 by using a mask.

In detail, a photosensitive film (not illustrated) is formed on the transparent material layer and the photosensitive film is patterned by using a mask (not illustrated) to form a photosensitive film pattern corresponding to a pattern of the transparent layer 313, and then the transparent material layer is patterned.

At this time, the mask may refer to a mask assembly including a frame having one or more openings (open areas) and a mask having one or more opening portions formed according to a certain pattern. In addition, according to example embodiments, a half-tone mask may be used.

Also, the photosensitive film may include a material (photoresist) that causes chemical changes when light is irradiated. For example, the photosensitive film may include, as a negative-type photoresist, aromatic bisazide, methacrylic acid ester, cinnamic acid ester, or the like, and may include, as a positive-type photoresist, poly(methylmethacrylate), naphthoquinonediazide, polybutene-1-sulfone, or the like, but are not limited thereto.

The transparent layer 313 formed as described above may include one or more protrusions PR, and the number, shape, height, location, or the like of the protrusions PR are not limited. For example, the protrusions PR may be formed on one or more of the adjacent first partitions B1. In other words, the transparent layer 313 may overlap the first-color color filter layer 311, overlap one or more of the adjacent first partitions B1, have a curve, and a shape in which a certain portion protrudes. For example, the transparent layer 313 may have a shape having a lowest point at a portion overlapping a central portion of the first-color color filter layer 311 and a highest point at a particular position of a portion overlapping the second partition B2, wherein the shape becomes higher in a direction away from the central portion of the first-color color filter layer 311 and decreases in height again after the highest point.

Figure 12:
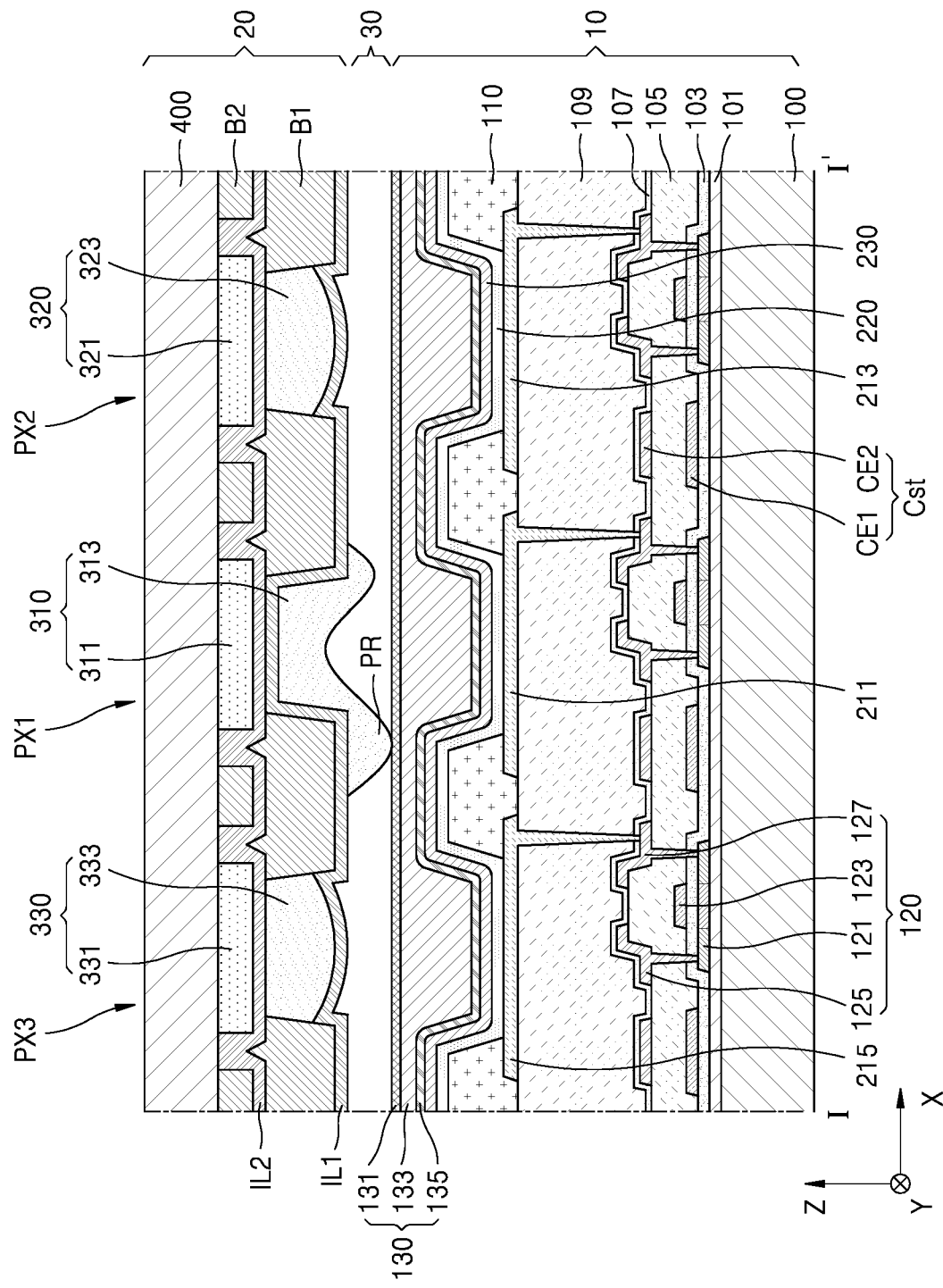
FIG. 12 is a schematic cross-sectional view illustrating a portion of a display apparatus according to another embodiment.

FIG. 12 is a schematic cross-sectional view illustrating a portion of a display apparatus according to another embodiment.

For example, as illustrated in FIG. 12, a protrusion PR of the transparent layer 313 may be located only above one of the adjacent first partitions B1 on a cross-sectional view.

Figure 13:
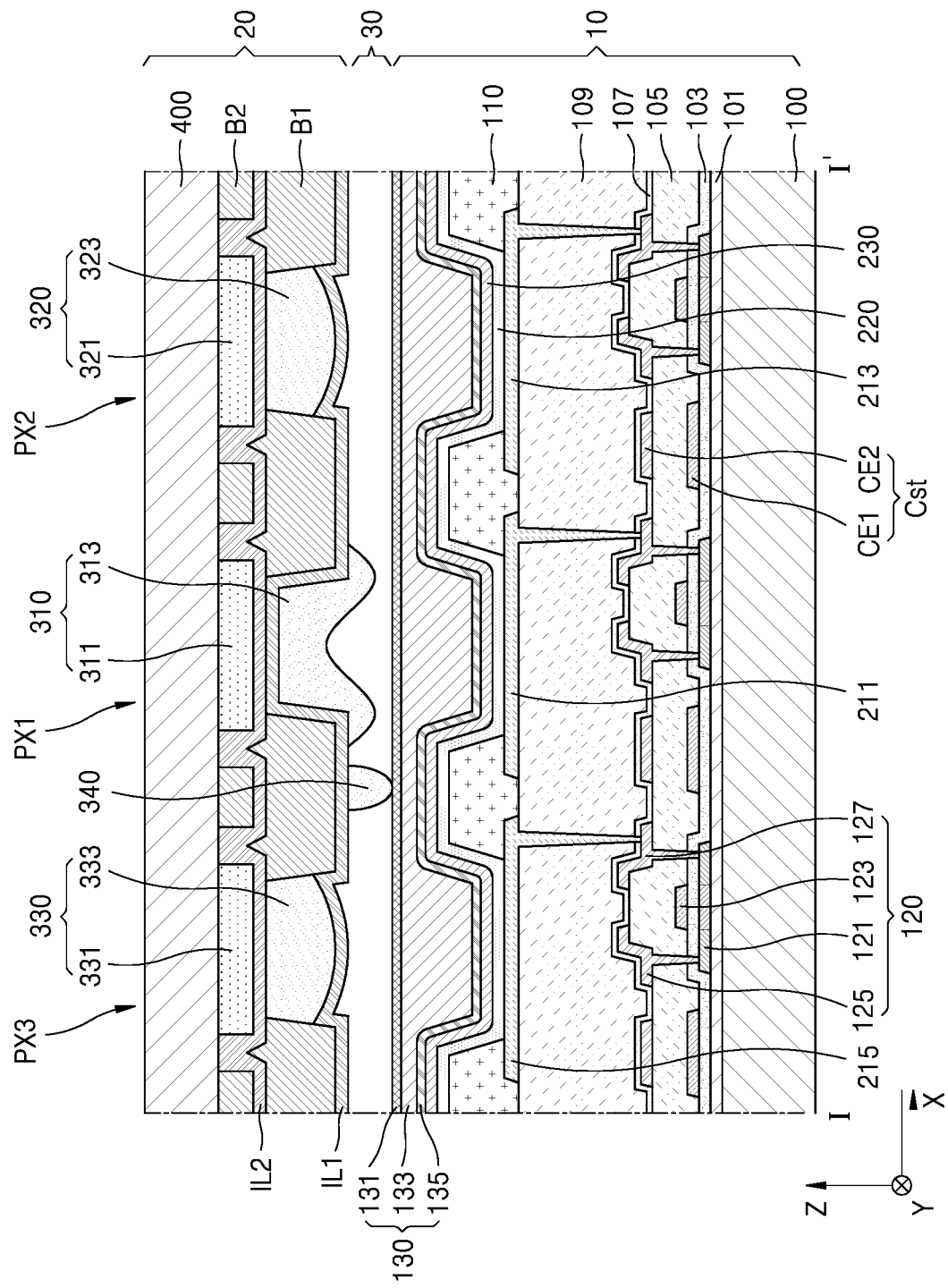
FIG. 13 is a schematic cross-sectional view illustrating a portion of a display apparatus according to another embodiment.

FIG. 13 is a schematic cross-sectional view illustrating a portion of the display apparatus 1 according to another embodiment.

The color filter unit 20 or the display apparatus 1 may further include a spacer 340. The spacer 340 may serve as a support that is similar to the protrusion PR of the transparent layer 313 described above. In other words, the spacer 340 may maintain a distance between the display unit 10 and the color filter unit 20 over a certain distance.

The spacer 340 may be located above the first partition B1 of the color filter unit 20. The spacer 340 may be arranged between the pixel defining film 110 of the display unit 10 and the first partition B1 of the color filter unit 20 when the display unit 10 and the color filter unit 20 are bonded. At this time, the spacer 340 may contact the uppermost layer of the display unit 10 and act as a support.

For example, the spacer 340 may be arranged between the pixel defining film 110 and the first partition B1, the pixel defining film 110 being between the first display element and the second display element of the display unit 10, and the first partition B1 being between the transparent layer 313 and the second color quantum dot layer 323 of the color filter unit 20. However, the spacer 340 is not limited thereto, and may be arranged between the pixel defining film 110 and the first partition B1, the pixel defining film 110 being between the first display element and the third display element of the display unit 10, and the first partition being between the transparent layer 313 and the third color quantum dot layer 333 of the color filter unit 20. In addition, a plurality of spacers 340 may be included.

The spacer 340 may be simultaneously formed when the transparent layer 313 is formed. In other words, in an operation of patterning a transparent material layer, the transparent layer 313 and the spacer 340 in an isolated shape may be formed at once. In this case, the layer structure of the spacer 340 may be the same as the layer structure of the transparent layer 313. In addition, the spacer 340 may include the same material as the transparent layer 313. When the transparent layer 313 includes the scattering particles SP, the spacer 340 may also include the scattering particles SP. Accordingly, the spacer 340 and the transparent layer 313 may not be separately formed, and thus, operation efficiency may be improved.

The number of the protrusions of the transparent layer 313 and/or spacers 340 may be adjusted according to example embodiments. As the number of protrusions and/or spacers 340 increases, the function of the support is strengthened, but the flow of a material (for example, the filler, or the like) in a liquid state desired in an operation may be hindered, and thus, the number of protrusions and/or spacers 340 in an appropriate level may be adjusted according to device desire.

As an example, the protrusions of the transparent layer 313 and/or the spacer 340 may be selectively formed on all or a portion of pixels included in the display apparatus 1. For example, the protrusions of the transparent layer 313 and/or the spacer 340 may be periodically formed in a unit of a certain number (for example, 4×4, 5×5, or the like). That is, the protrusions of the transparent layer 313 may be selectively arranged with respect to a plurality of pixels according to a predetermined period or pattern.

As another example, the number, shape, height, location, or the like of the protrusions of the transparent layer 313 and/or the spacers 340 in pixels, in which the protrusions of the transparent layer 313 and/or the spacers 340 are located, may be variously designed. For example, one or more protrusions of the transparent layer 313, one or more spacers 340, or one or more protrusions of the transparent layer 313 and one or more spacers 340 may be located in a selected pixel according to a predetermined period or pattern.

A color filter unit and a display apparatus are mainly described, but the disclosure is not limited thereto. For example, a color filter unit manufacturing method of manufacturing the color filter unit and a display apparatus manufacturing method of manufacturing the display apparatus also belong to the scope of the inventive concepts.

According to the above-stated embodiment, a color filter unit having an improved defect rate and an improved viewing angle, and a display apparatus including the color filter unit may be implemented. The scope of the inventive concepts are limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

Some of the advantages that may be achieved by exemplary implementations/embodiments of the invention and/or exemplary methods of the invention include ***

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A color filter unit comprising:
   an upper substrate;
   a first-color color filter layer, a second-color color filter layer, and a third-color color filter layer on a first surface that is a lower surface of the upper substrate;
   a transparent layer on the first-color color filter layer, a surface of the transparent layer having a first part apart from the first surface by a first distance in a direction away from the first surface and one or more protrusions apart from the first surface by a second distance greater than the first distance in the direction away from the first surface;
   a second color quantum dot layer on the second-color color filter layer;
   a third color quantum dot layer on the third-color color filter layer; and
   a partition between the transparent layer and the second color quantum dot layer; and
   a spacer on the partition,
   wherein the spacer and the transparent layer each include scattering particles.

2. The color filter unit of claim 1, wherein the transparent layer includes scattering particles.

3. The color filter unit of claim 1, wherein the spacer is made of the same material as that of the transparent layer.

4. The color filter unit of claim 1, further comprising:
   a first protective layer between the first-color color filter layer and the transparent layer and covering an upper surface of the second color quantum dot layer and an upper surface of the third color quantum dot layer.

5. The color filter unit of claim 4, wherein the first protective layer is integral over an entire surface of the upper substrate.

6. The color filter unit of claim 1, wherein the second color quantum dot layer converts light having a wavelength in a first wavelength band into light having a wavelength in a second wavelength band, and the third color quantum dot layer converts light having a wavelength in the first wavelength band into light having a wavelength in a third wavelength band.

7. A display apparatus comprising:
   a display unit including a lower substrate and a first display element, a second display element, a third display element on the lower substrate, and a pixel defining film between the first display element and the second display element; and
   a color filter unit including an upper substrate having a first surface that is a lower surface facing the first display element, the second display element, and the third display element,
   wherein the color filter unit comprises:
   a first-color color filter layer, a second-color color filter layer, a third-color color filter layer on the first surface of the upper substrate to respectively overlap the first display element, the second display element, and the third display element, and a partition between the transparent layer and the second color quantum dot layer; and
   a spacer between the pixel defining film and the partition and contacting an uppermost layer of the display unit;
   a transparent layer on the first-color color filter layer, a surface of the transparent layer having a first part apart from the first surface by a first distance in a direction away from the first surface and one or more protrusions apart from the first surface by a second distance greater than the first distance in the direction away from the first surface;
   a second color quantum dot layer on the second-color color filter layer; and
   a third color quantum dot layer on the third-color color filter layer,
   wherein the spacer and the transparent layer each include scattering particles.

8. The display apparatus of claim 7, wherein the one or more protrusions contact an uppermost layer of the display unit.

9. The display apparatus of claim 7, wherein the transparent layer includes scattering particles.

10. The display apparatus of claim 7, wherein the spacer is made of the same material as that of the transparent layer.

11. The display apparatus of claim 7, wherein the second color quantum dot layer is between the second-color color filter layer and the second display element, and the third color quantum dot layer is between the third-color color filter layer and the third display element.

12. The display device of claim 11, wherein the color filter unit further comprises:
    a first protective layer between the first-color color filter layer and the transparent layer and covering a surface of the second color quantum dot layer in a direction of the second display element and a surface of the third color quantum dot layer in a direction of the third display element.

13. The display apparatus of claim 12, wherein the first protective layer is integral over an entire surface of the upper substrate.

14. The display apparatus of claim 7, wherein the first display element, the second display element, and the third display element comprise:
    a first pixel electrode, a second pixel electrode, and a third pixel electrode, respectively;
    an opposite electrode corresponding to the first pixel electrode, the second pixel electrode, and the third pixel electrode; and
    an intermediate layer between each of the first pixel electrode, the second pixel electrode, and the third pixel electrode and the opposite electrode and including a first-color emission layer emitting light having a wavelength in a first wavelength band.

\* \* \* \* \*